(12) United States Patent
Misic

(10) Patent No.: US 6,714,013 B2
(45) Date of Patent: *Mar. 30, 2004

(54) MAGNETIC RESONANCE IMAGING RECEIVER/TRANSMITTER COILS

(75) Inventor: George J. Misic, Allison Park, PA (US)

(73) Assignee: Medrad, Inc., Indianola, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/151,491

(22) Filed: May 20, 2002

(65) Prior Publication Data

US 2002/0167321 A1 Nov. 14, 2002

Related U.S. Application Data

(60) Continuation of application No. 09/776,132, filed on Feb. 2, 2001, now Pat. No. 6,396,273, which is a continuation of application No. 09/512,093, filed on Feb. 24, 2000, now abandoned, which is a division of application No. 08/979,842, filed on Nov. 26, 1997, now Pat. No. 6,040,697.

(51) Int. Cl.$^7$ ................................................. G01N 3/00
(52) U.S. Cl. ........................................ 324/318; 324/322
(58) Field of Search ................................. 324/318, 322, 324/300, 306, 307, 309, 312, 314

(56) References Cited

U.S. PATENT DOCUMENTS

| | | |
|---|---|---|
| 4,411,270 A | 10/1983 | Damadian |
| 4,467,282 A | 8/1984 | Siebold |
| 4,680,548 A | 7/1987 | Edelstein et al. |

(List continued on next page.)

FOREIGN PATENT DOCUMENTS

| | | |
|---|---|---|
| EP | 0 758 091 | 2/1997 |
| EP | WO 98/37438 | 8/1998 |

OTHER PUBLICATIONS

Adriany, G., et al., "A Transmit/Receive Quadrature Birdcage Array Coil for 4 Tesla," Proceedings of the International Society for Magnetic Resonance in Medicine, Fifth Scientific Meeting and Exhibition, vol. 1, p. 177 (Apr. 12–18, 1997).

Adriany, G., et al., "A Transmit/Receive Quadrature Birdcage Array for 4 Tesla," Presentation to the International Society for Magnetic Resonance in Medicine, Fifth Scientific Meeting and Exhibition, Vancouver, B.C., Canada (Apr. 12–18, 1997).

Fitzsimmons, Jeffrey R., et al., "Radio Frequency Coil Development for High Field Whole Body MRI/MRS," High Field Workshop (Mar. 7, 1997).

Fitzsimmons, Jeffrey R., et al., "Very High Frequency Transceiver Phased Array RF Coil Development for Neuroimaging of the Human Cortex and Spinal Cord at 3 Tesla," NIH Grant Application (Feb. 1, 1997).

(List continued on next page.)

Primary Examiner—Louis Arana
(74) Attorney, Agent, or Firm—Gregory L. Bradley; James R. Stevenson

(57) ABSTRACT

A magnetic resonance imaging receiver/transmitter coil system for providing images for regions of interest includes a first phased array formed of a plurality of electrically conductive members and defining an array volume and a second phased array formed of a second plurality of electrically conductive members and disposed at least partially within the defined array volume. At least one of the first and second phased arrays is adapted to apply a magnetic field to the defined array volume. At least one of the first and second phased arrays is further adapted to receive said applied magnetic field. The first phased array is extendible to define a further array volume and is provided with a switch for electrically coupling and decoupling an extension to effectively extend the length of the first phased array and thereby define the further array volume. In this manner the length of the first phased array is effectively extended to approximately twice its unextended length.

83 Claims, 6 Drawing Sheets

U.S. PATENT DOCUMENTS

| | | | |
|---|---|---|---|
| 4,692,705 A | | 9/1987 | Hayes |
| 4,707,664 A | | 11/1987 | Fehn et al. |
| 4,793,356 A | | 12/1988 | Misic et al. |
| 4,825,162 A | | 4/1989 | Roemer et al. |
| 4,833,429 A | * | 5/1989 | Keren et al. ............... 333/156 |
| 4,923,459 A | | 5/1990 | Nambu |
| 5,179,332 A | | 1/1993 | Kang |
| 5,258,717 A | | 11/1993 | Misic et al. |
| 5,374,890 A | | 12/1994 | Zou et al. |
| 5,394,087 A | | 2/1995 | Molyneaux |
| 5,483,158 A | | 1/1996 | van Heteren et al. |
| 5,543,711 A | | 8/1996 | Srinivasan et al. |
| 5,551,430 A | | 9/1996 | Blakeley et al. |
| 5,559,434 A | | 9/1996 | Takahashi et al. |
| 5,565,779 A | | 10/1996 | Arakawa et al. |
| 5,578,925 A | | 11/1996 | Molyneaux et al. |
| 5,602,479 A | | 2/1997 | Srinivasan et al. |
| 5,610,521 A | | 3/1997 | Zou et al. |
| 5,621,323 A | | 4/1997 | Larsen |
| 5,646,531 A | | 7/1997 | Renz |
| 5,664,568 A | | 9/1997 | Srinivasan et al. |
| 5,696,449 A | | 12/1997 | Boskamp |
| 5,998,999 A | | 12/1999 | Richard et al. |
| 6,028,429 A | * | 2/2000 | Green et al. ............... 324/318 |
| 6,040,697 A | | 3/2000 | Misic |
| 6,137,291 A | | 10/2000 | Szumowski et al. |
| 6,150,816 A | | 11/2000 | Srinivasan |
| 6,177,797 B1 | | 1/2001 | Srinivasan |
| 6,249,121 B1 | * | 6/2001 | Boskamp et al. ........... 324/318 |
| 6,323,648 B1 | * | 11/2001 | Belt et al. .................. 324/322 |

OTHER PUBLICATIONS

Reykowski, A., et al., "Novel Two Channel Volume Array Design for Angiography of the Head and Neck," Proceedings of the Society of Magnetic Resonance, Second Meeting, vol. 1, p. 216 (Aug. 6–12, 1994).

Reykowski, A., Theory and Design of Synthesis Array Coils for Magnetic Resonance Imaging, (see pp. 162–191), Dissertation submitted to the Office of Graduate Studies of Texas A&M University (Dec. 1996).

Szumowski, J., et al., "A Telescopic Phased Array Coil for MRA of the Lower Extremities," Proceedings of the Society of Magnetic Resonance, vol. 2 (Aug. 19–25, 1995).

Merkle, H., et al., "A Dual–Quadrature, Transmit/Receive Surface Coil Design for Brain Studies at High Fields," International Society of Magnetic Resonance in Medicine, p. 962 (1995).

Monroe, J. W., et al., "Phased Array Coils for Upper Extremity MRA," MRM 33: 224–229 (1995).

Reykowski, A., "Transmit–Receive Array for Angiography of the Head and Neck," Unpublished Paper (1995).

Lian, J., et al., "Detachable RF Coil for Clinical Breast Imaging," Proceedings of the Society of Magnetic Resonance, vol. 1 (Aug. 19–25, 1995).

Complaint, Civil Action No. 02–2044, Medrad, Inc., (Plaintiff) v. MRI Devices Corporation (Defendant), Patent Infringement of Medrad's Patent USPN 6,396,273 (Nov. 25, 2002).

Answer, Civil Action No. 02–2044 (Dec. 16, 2002).

MRI Devices Corporation's Response to Medrad's First Set of Interrogatories, Civil Action No. 02–2044 (Jan. 20, 2002).

Plantiff Medrad's Responses to Defendant's First Set of Interrogatories, Civil Action No. 02–2044 (Jan. 20, 2003).

Medrad's Responses and Objections to Defendant's Second Set of Interrogatories, Civil Action 02–2044 (Jan. 29, 2003).

Medrad's Responses and Objections to Defendant's Third Set of Interrogatories, Civil Action No. 02–2044 (Jan. 30, 2003).

Plantiff Medrad's Reponses to Defendant's Fifth Set of Interrogatories, Civil Action No. 02–2044 (Feb. 21, 2003).

MRI Devices Corporation's Supplemental Response to Medrad's Interrogatory No. 11, Civil Action 02–2044 (Feb. 21, 2003).

Medrad's Supplemental Responses and Objections to Defendant's First Set of Requests for Admissions, Civil Action No. 02–2044 (Feb. 24, 2003).

Medrad's Objections/Responses to Defendant's Fourth Set of Interrogatories, Civil Action No. 02–2044 (Mar. 4, 2003).

Duensing, G. R., et al., "Transceive Phased Array Designed for Imaging at 3T," Presentation at the High Field Imaging Workshop (Mar. 7, 1997).

Reykowski, A., et al., "Novel Two Channel Volume Array Design For Angiography of the Head andNeck," Presentation at the Society of Magnetic Resonance Meeting (Aug. 6–12, 1994).

MRI Devices Corporation's Second Supplemental Response to MEDRAD's Interrogatory No. 11, Civil Action 02–2044 (Mar. 10, 2003).

Expert Report of Dr. Peter B. Roemer Concerning Invalidity of Claims 1, 2, 3, 5, 16, and 23 of U.S. Patent 6,396,273, Civil Action 02–2044 (Mar. 14, 2003).

"Optimized Birdcage Resonators for Simultaneous MRI of Head and Neck," Proceedings of the Society of Magnetic Resonance, p. 1349 (1993).

"Surface Coil Proton MR Imaging at 2T," Radiology, 161, No. 1, pp. 251–255, (Oct. 1986).

"Spatial Localization in 31P and 13C NMR Spectroscopy in vivo Using Surface Coils," Journal of Magentic Resonance in Medicine, 1: 410–413 (1984).

"Comparison of Linear and Circular Polarization for Magnetic Resonance Imaging," Journal of Magnetic Resonance 64, 255–270 (1985).

Transcript of Testimony of Dr. Arne Reykowski at the Hearing ("Reykowski Transcript").

Deposition of Dr. Gregor Adriany ("Adriany Deposition").

Expert Report of Dr. Peter B. Roemer Concerning Noninfringment of Claims 1, 2, 3, 5, 16 and 23 of U.S. Patent No. 6,396,273 ("Roemer Noninfringment Report").

Expert Report of Kimberly A. Moore ("Moore Report").

MRI Devices' Motion for Summary Judgment of Noninfringemnet of the '273 Patent ("MRIDC's SJ Motion of Noninfringement").

MRI Devices' Memorandum Supporting Its Motion for Summary Judgment of Noninfringement of the '273 Patent ("MRIDC's Memo Supporting SJ Motion of Noninfringement").

MRI Devices' Motion for Summary Judgment to Invalidate Claims 1, 2, 3, 5, 16 and 23 of U.S. Patent No. 6,396,273 ("MRIDC's SJ Motion to Invalidate").

MRI Devices' Memorandum Supporting Its Motion for Summary Judgment to Invalidate Claims 1, 2, 3, 5, 16 and 23 of U.S. Patent No. 6,396,273 (MRIDC's Memo Supporting Invalidity Motion).

Appendix In Support of MRI Devices' Motion for Summary Judgment to Invalidate Claims 1, 2, 3, 5, 16 and 23 of U.S. Patent No. 6,396,273 ("MRIDC's Appendix to Invalidity Motion").

Medrad's Opposition to MRI Devices' Motion for Partial Summary Judgment to Invalidate Certain Claims of U.S. Patent No. 6,396,273 ("Medrad's Opposition to MRIDC's SJ Motion To Invalidate").

MRI Devices' Reply Supporting Its Motion for Summary Judgment to Invalidate All Asserted Claims of U.S. Patent No. 6,396,273 ("MRIDC's Reply").

Appendix In Support of MRI Devices' Reply Supporting Its Motion for Summary Judgment to Invalidate All Asserted Claims of U.S. Patent No. 6,396,273 ("MRIDC's Appendix to Reply").

Report and Recommendation of Magistrate Judge to Federal District Judge Terrence F. McVerry ("Magistrate's Report and Recommendation").

Plaintiff Medrad's Supplemental Responses to Defendant's First Set of Interrogatories (Mar. 26, 2003).

Expert Report of Dr. Cecil E. Hayes Pursuant to Rule 26(a)(2)(B) of the Federal Rules of Civil Procedure (Mar. 31, 2003).

Expert Report of Kenneth W. Belt Pursuant to Rule 26(a)(2)(B) of the Federal Rules of Civil Procedure (Mar. 31, 2003).

P. B. Roemer, et al., "The NMR Phased Array," Magnetic Resonance in Medicine, vol. 16, Copyright 1990, Academic Press, Inc., pp. 192–225.

H. Requardt, et al., "Switched Array Coils," Magnetic Resoance in Medicine, vol. 13, Mar. 1990, No. 3, pp. 385–397, XP 000132470.

R. Duensing, et al., "A Continuously Variable Field of View Surface Coil," Magnetic Resonance in Medicine, vol. 13, No. 3, Mar. 1990, pp. 378–384, XP 000132469.

J. Jin, et al., "An Innovative Design of Combined Transmit/Receive RF Coil for MR Imaging," Department of Electrical and Computer Engineering, University of Illinois at Urbana–Champaign, Urbana, IL, Phillips Medical Systems North America, Shelton, CT, Aug. 1994, p. 1116, XP 002092172.

International Search Report for Counterpart PCT Application No. PCT/US98/23454.

"Knee Foot and Ankle Array," produced and sold by MRI Devices Corporation of Waukesha, WI, under Model No. KFA, Product Data Jul. 2000, CE0413.

Memorandum Order, Medrad, Inc. vs. MRI Devices Corporation, Civil Action No. 02–2044, Aug. 13, 2003.

* cited by examiner-

MAGNETIC RESONANCE IMAGING RECEIVER/TRANSMITTER COILS

CROSS-REFERENCE TO RELATED APPLICATIONS

This application for patent is a continuation of U.S. application Ser. No. 09/776,132, filed Feb. 2, 2001, now issued as U.S. Pat. No. 6,396,273 on May 28, 2002. The '132 application is a continuation of U.S. application Ser. No. 09/512,093, filed Feb. 24, 2000, now abandoned, which is a divisional of U.S. application Ser. No. 08/979,842, filed Nov. 26, 1997, now issued as U.S. Pat. No. 6,040,697 on Mar. 21, 2000. The contents of the aforementioned documents are incorporated herein by reference.

BACKGROUND OF THE INVENTION

The present invention relates to the field of magnetic resonance imaging (MRI) systems and, more particularly, to coils for use in such systems.

It is well known in the field of MRI systems to provide radio frequency signals in the form of circularly polarized or rotating magnetic fields having an axis of rotation aligned with a main magnetic field. It is also well known to use receiving coils to intercept a radio frequency magnetic field generated by a human subject or an object in the presence of the main magnetic field in order to provide an image of the human subject or the object.

Receiving coils of this type were formed as volume coils in order to enclose a volume for receiving a body part such as a leg, arm or hand and intercept the radio magnetic field. See, for example, U.S. Pat. No. 4,411,270 issued to Damadian and U.S. Pat. No. 4,923,459 issued to Nambu. Additionally, surface receiving coils were developed for this purpose. The surface receiving coils were placed adjacent a region of interest. For a surface receiving coil, see U.S. Pat. No. 4,793,356 to Misic et al., for example.

Advances in the field of MRI systems have resulted in modifications to both volume receiving coils and surface receiving coils in order to improve their signal to noise ratios. This was achieved by modifying the receiving coils to receive perpendicular components of the radio frequency magnetic field. These improved coils are known as quadrature coils. Quadrature coils provided a significant signal to noise ratio improvement over non-quadrature coils. See, for example, U.S. Pat. No. 4,467,282 issued to Siebold and U.S. Pat. No. 4,707,664 issued to Fehn.

In U.S. Pat. No. 5,258,717, issued to Misic, a quadrature receiving coil system was provided, along with a data acquisition system. The data acquisition system taught by Misic included multiple image processing channels for processing a plurality of MRI signals and combining the processed signals to produce an image. The receiving coil system of Misic was formed of multiple quadrature receiving coils, the receiving coils being adapted to intercept both of the quadrature components of the magnetic resonance signals in a spatially dependent manner. Such quadrature coil systems provided coverage of a portion of a total target sensitive volume along an axis parallel to the main magnetic field. Consequently, each receiving coil of the system had a sensitive volume smaller than that which would otherwise be necessary. Thus, each receiving coil provided an improved signal to noise ratio for the region within its sensitive volume. Two leads were connected to each receiving coil and each lead was connected to a separate processing channel of the data acquisition system. The outputs of the processing channels were combined and a final data set from the entire target sensitive volume was calculated. The calculated data set had a better signal to noise ratio greater than that which could be achieved with a single receiving coil.

However, the various receiving coils of the prior art described had a number of artifact problems. For example, an image provided using the prior art receiving coils could have artifacts due to aliasing caused when the phase of a signal from a part of the anatomy within the field of the coil duplicates that of a location elsewhere. This occurs because a phase location of 370 degrees appears to the system as a phase location of 10 degrees. Thus, a signal from anatomy at a phase location of −350 or 370 degrees manifests itself in the image at a phase location of 10 degrees within the field of view. Elimination of phase wrap essentially halves the actual phase field of view, shifting from −90 to +90 degrees rather than from −180 to +180 degrees. However, this merely moves the alias location to more than +/−1.5 the field of view rather that eliminating it.

Another form of artifact, sometimes referred to as an annafact, can occur in either the frequency direction or the phase direction within prior art MRI systems. In this type of artifact, an area of anatomy that is at least partially within the excitation field of the body coil has a local Larmour frequency identical to a pixel within the imaging field of view. If there is any excitation and subsequent pickup of this material, it appears within the field of view superimposed upon the desired image, regardless of whether the artifact comes in from the frequency direction or the phase direction. The problems associated with this type of artifact are worsened by the use of higher speed gradients that are shorter in physical size and lower field uniformity.

OBJECTIVES OF THE INVENTION

It is therefore an objective of the invention to provide a coil system and/or method that eliminates soft tissue artifacts and aliasing artifacts typical of prior art systems and/or methods for imaging various regions of interest.

Another objective of the present invention is to provide improved signal to noise performance, for example, by permitting the use of smaller fields of view and thinner slices when performing imaging.

Another objective of the present invention is to provide greater image uniformity than provided in the prior art.

Another objective of the invention is to facilitate complete imaging of the regions of interest during a magnetic resonance imaging (MRI) procedure.

In addition to the objectives and advantages listed above, various other objectives and advantages of the invention will become apparent to persons skilled in the relevant art from a reading of the detailed description and other sections of this document.

SUMMARY OF THE INVENTION

A magnetic resonance imaging receiver/transmitter coil system for providing images for regions of interest includes a first phased array coil element formed of a plurality of electrically conductive members and defining an array volume and a second phased array coil element formed of a second plurality of electrically conductive members and disposed at least partially within the defined array volume. At least one of the first and second phased arrays is adapted to apply a magnetic field to the defined array volume. At least one of the first and second phased arrays is further adapted to receive said applied magnetic field. The first phased array is extendible to define a further array volume and is provided with a switch for electrically coupling and decoupling an extension to effectively extend the length of the first phased array and thereby define the further array volume. In this manner the length of the first phased array is effectively extended to approximately twice its unextended length.

DETAILED DESCRIPTION OF THE INVENTION

Figure 1:
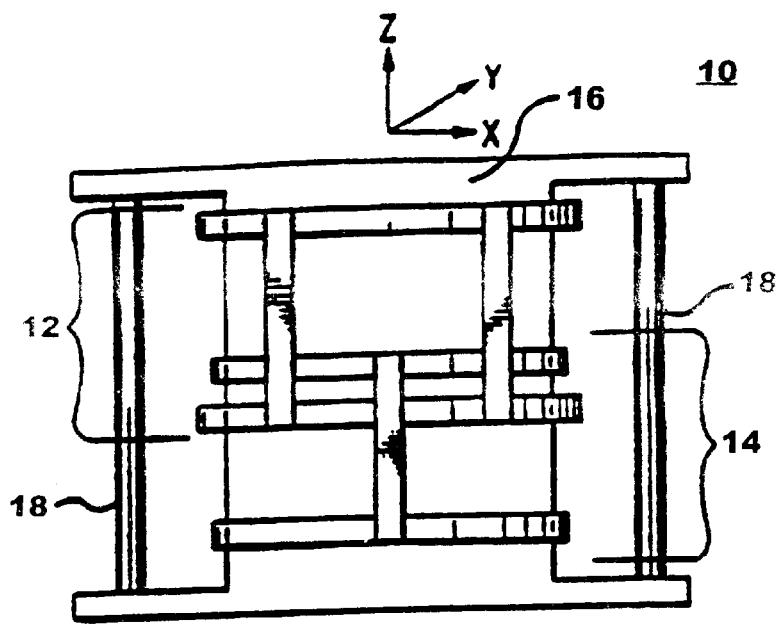
FIG. 1 is a side view of a prior art multiple quadrature receiving coil system wherein each coil of the quadrature coil system is a birdcage coil.
Figure 2:
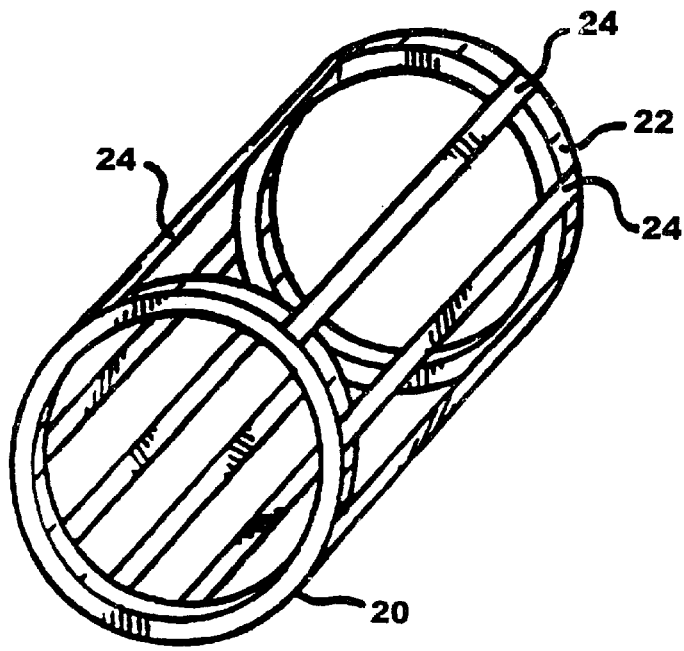
FIG. 2 is a perspective view of a single quadrature birdcage coil forming part of the prior art multiple quadrature receiving coil system of FIG. 1.

Referring now to FIGS. 1 and 2, there is shown a prior art multiple quadrature receiving coil system 10. This prior art multiple quadrature receiving coil system 10 was formed of quadrature receiving coils 12 and 14, which were designed for a variety of anatomical regions of the body, such as the knee, leg, arm or head. Quadrature receiving coils 12, 14 of quadrature receiving coil system 10 are thus volume coils. Coils 12, 14 are disposed around a hollow cylindrical drum support member 16. Support rods 18 extending the length of cylindrical drum 16 can be provided to stabilize the cylindrical drum support member 16.

Quadrature receiving coils 12, 14 are of a type referred to as birdcage coils, as well known in the art. They are formed of circular conductive loops 20, 22 connected to each other and spaced apart from each other by conductive connection members 24. There may be eight electrically conductive connection members 24 or rods 24 joining circular conductive loops 20, 22. Each receiving coil 12, 14 of coil system 10 formed in this manner can function as a separate quadrature receiving coil within coil system 10.

Magnetic interaction between quadrature receiving coils 12, 14 is eliminated by positioning quadrature receiving coils 12, 14 about drum support member 16 to provide radial symmetry about the axis parallel to the main magnetic field, which is the Z-axis shown in FIG. 1. Moreover, quadrature coil 12 is slightly larger in diameter than quadrature coil 14 so that coil 12 can overlap a portion of coil 14. The amount of overlap of coils 12, 14 is adjusted so that the net flux from one coil, as seen as the vector sum of the flux from the overlap region, exactly cancels the flux from the return through the balance of the coil. In this case the field vector of the overlap region can be substantially equal to the field vectors of the other two regions. This causes the net shared flux of zero and thus a net mutual inductance of zero between quadrature receiving coils 12, 14. Coils 12, 14 maintain their isolation regardless of the relative rotational position about their common axis.

Quadrature coils 12, 14 of receiving coil system 10 have symmetry about two planes parallel to the Z-axis. The two planes of symmetry are at right angles to each other. In addition, quadrature coils 12, 14 are arranged so that the rotating magnetic vector of each receiving coil 12, 14 is in the X–Y plane. However, the net rotating magnetic vectors of coils 12, 14 are spatially displaced from each other along the Z-axis. In this regard, each receiving coil 12, 14 intercepts the quadrature components of the magnetic resonance signal within its own sensitive volume.

Figure 3:
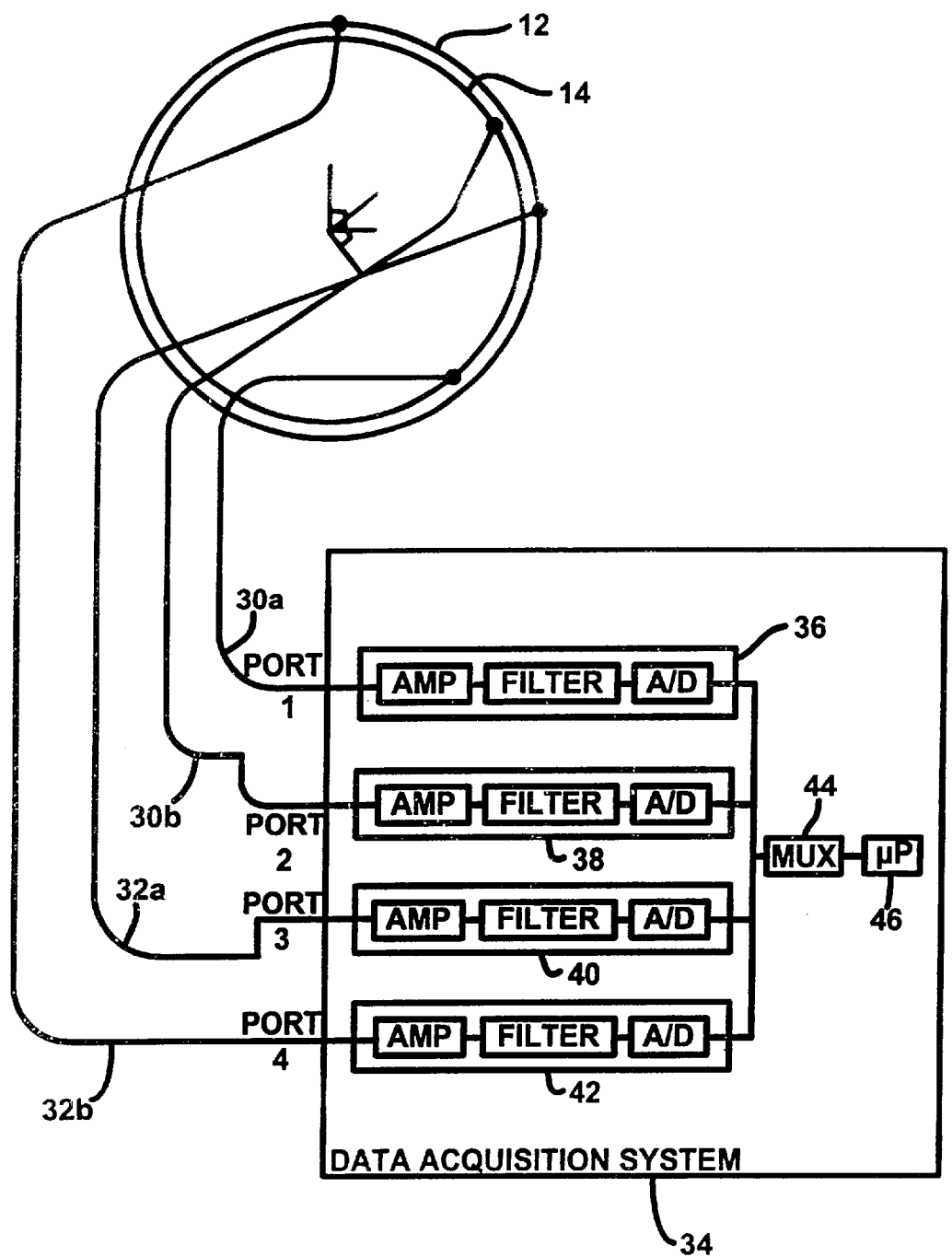
FIG. 3 is a schematic diagram illustrating possible electrical connections of the prior art multiple quadrature receiving coil system of FIG. 1.

Referring now to FIG. 3, there is shown a schematic representation of electrical connections that can be made to quadrature receiving coils 12, 14 of prior art quadrature receiving coil system 10. In this system, a plurality of electrical leads 30a, b are connected to quadrature coil 14 and a plurality of electrical leads 32a, b are connected to quadrature coil 12. The electrical leads 30a, b and 32a, b are preferably coaxial leads. Each coaxial lead 30a, b and 32a, b thus includes a center conductor and a shield, as is well known in the art. Each coaxial lead 30a, b and 32a, b coupled to quadrature coils 12, 14 is connected to a respective port 1–4 of data acquisition system 34. Data acquisition system 34 is described in an article by Roemer et al., entitled "The NMR Phased Array," Magnetic Resonance in Medicine, vol. 16 (1990), pp. 192–225. System 34 is provided with multiple data processing channels 36–42. Each data processing channel 36–42 includes an individual amplifier, filter, and A/D converter for processing the image signals received by a corresponding coaxial lead 30a, b or 32a, b. The outputs of data processing channels 36–42 are multiplexed by multiplexer 44 and combined by microprocessor 46 according to a weighting algorithm. The weighting algorithm is adapted to select the outputs of processing channels 36–42 and combine them to produce an overall image signal. For example, a combined image signal having a maximum signal to noise ratio can be provided by the weighting algorithm performed by microprocessor 46. Coaxial leads 30a, b are connected to quadrature coil 14 at points that are at ninety degrees relative to each other and to ports 1, 2 of data acquisition system 34. Likewise, coaxial leads 32a, b are connected to quadrature coil 12 at points that are disposed at ninety degrees relative to each other. Coaxial leads 32a, b are also connected to ports 3, 4 of data acquisition system 34. An electrical network (not shown) can be interconnected between quadrature receiving coils 12, 14 and coaxial leads 30a, b and 32a, b to appropriately connect the cables to quadrature coils 12, 14. Such electrical networks are well known in the art. Furthermore, when being fixed together during assembly, quadrature coils 12, 14 can be rotated (i.e., can accommodate different angular orientations) relative to one another without destroying the signal to noise improvements achieved in accordance with this prior art method. This is taught in U.S. Pat. No. 5,258,717 to Misic and incorporated by reference herein.

Figure 4:
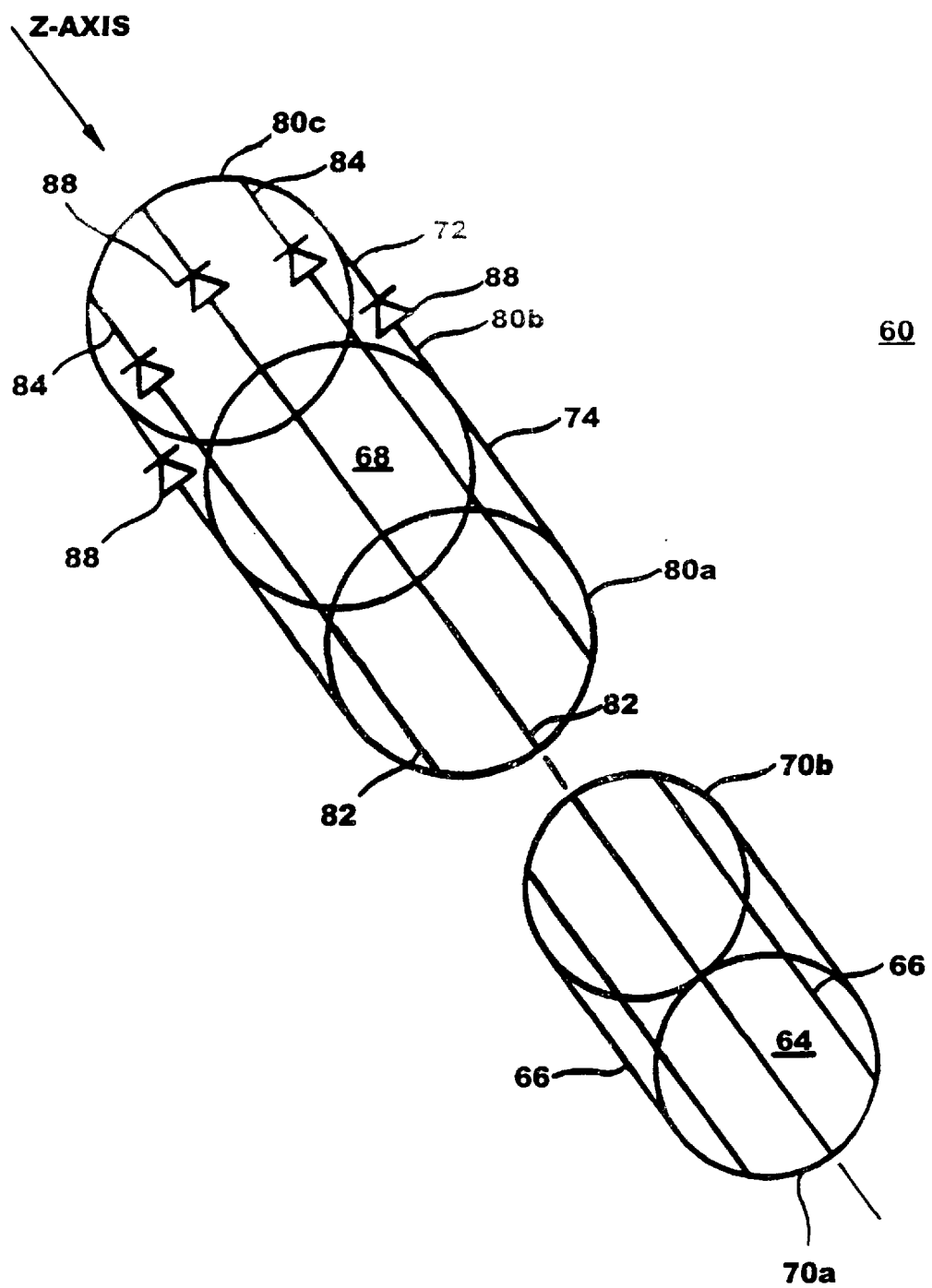
FIG. 4 is an exploded perspective view of a multiple quadrature receiver/transmitter coil system according to a preferred embodiment of the present invention.

Referring now to FIG. 4, there is shown an embodiment of the magnetic receiver/transmitter coil array system 60 of the present invention. Transmit/receive coil array system 60 can be formed of two quadrature birdcage coils: outer quadrature coil 68 and inner quadrature coil 64. Inner quadrature coil 64 can be disposed partially within the volume defined by outer quadrature coil 68. The quadrature coils 64, 68 can thus be provided with a critical overlap to reduce the mutual inductance therebetween and to therefore reduce the signal coupling between the coils 64, 68 to a negligible level, in a manner substantially as described for coil array system 10. In one possible preferred embodiment of coil array system 60, inner quadrature coil 64 can have a diameter of approximately 19.4 centimeters and outer quadrature coil 68 can have a diameter of approximately 22.5 centimeters. While coil array system 60 is shown in an exploded view for purposes of illustration, it will be understood that inner quadrature coil 64 is disposed within outer quadrature coil 68 during normal operation of coil array system 60.

In the preferred embodiment of coil array system 60 (as discussed in more detail below with respect to FIG. 6), inner coil 64 can be formed with eight electrically conductive rods 66 fixed to electrically conductive end rings 70*a,b*. Outer quadrature coil 68 can be formed of two sections: receive/transmit coil section 74 and auxiliary transmit coil section 72. Receive/transmit section 74 can be provided with eight electrically conductive rods 82 fixed to electrically conductive end rings 80*a,b* which act cooperatively to define an array volume. Auxiliary transmit coil section 72 can be provided with eight electrically conductive rods 84 connecting electrically conductive end rings 80*b,c*. Rods 66, 82 and 84 as well as end rings 70*a,b* and 80*a,b,c* can be any kind of electrical conductors such as, for example, conductive tubing, etched copper or copper tape or any other material suitable for inducing and detecting a magnetic field.

Furthermore, each conductive rod 84 of auxiliary transmit coil section 72 can be provided with a PIN diode 88. When PIN diodes 88 of auxiliary coil section 72 are forward biased, conductive rods 84 and ring 80*c* are electrically coupled to receive/transmit coil section 74. Thus, PIN diodes 88 can be used to couple and decouple portions of rods 84 and thereby substantially couple and decouple transmit coil section 72 and transmit/receive coil section 74. When conductive rods 84 or rod extensions 84 are switched in by PIN diodes 88 in this manner, the effective length of receive/transmit coil section 74 can be extended to thereby define a further array volume. PIN diodes 88 are forward biased and the length of coil section 74 is thereby extended in this manner when electrical energy is applied to outer coil 68 for the purpose of creating a magnetic field to form a magnetic resonance image. Although PIN diodes 88 can be used in the preferred embodiment for extending the length of outer coil 68, any kind of coupling and decoupling circuit known to those skilled in the art can be used.

It will be understood that coil array system 60 can be used for left or right imaging of the musculoskeletal system of human subjects. For example, coil array system 60 can be used for imaging a knee, a foot, an ankle, a wrist or a hand. The anatomical structures that can be imaged and evaluated using coil array system 60 can include ligaments, tendons, cartilage, osseous structures, fluid filled bursa, adipose tissue, muscle and potential pathological lesions. Furthermore, coil array system 60 is adapted to permit easy placement of the anatomy of interest within the array volume defined by coils 64, 68 and adapted to be disposed on a base to permit positioning left and right of isocenter.

Figure 5:
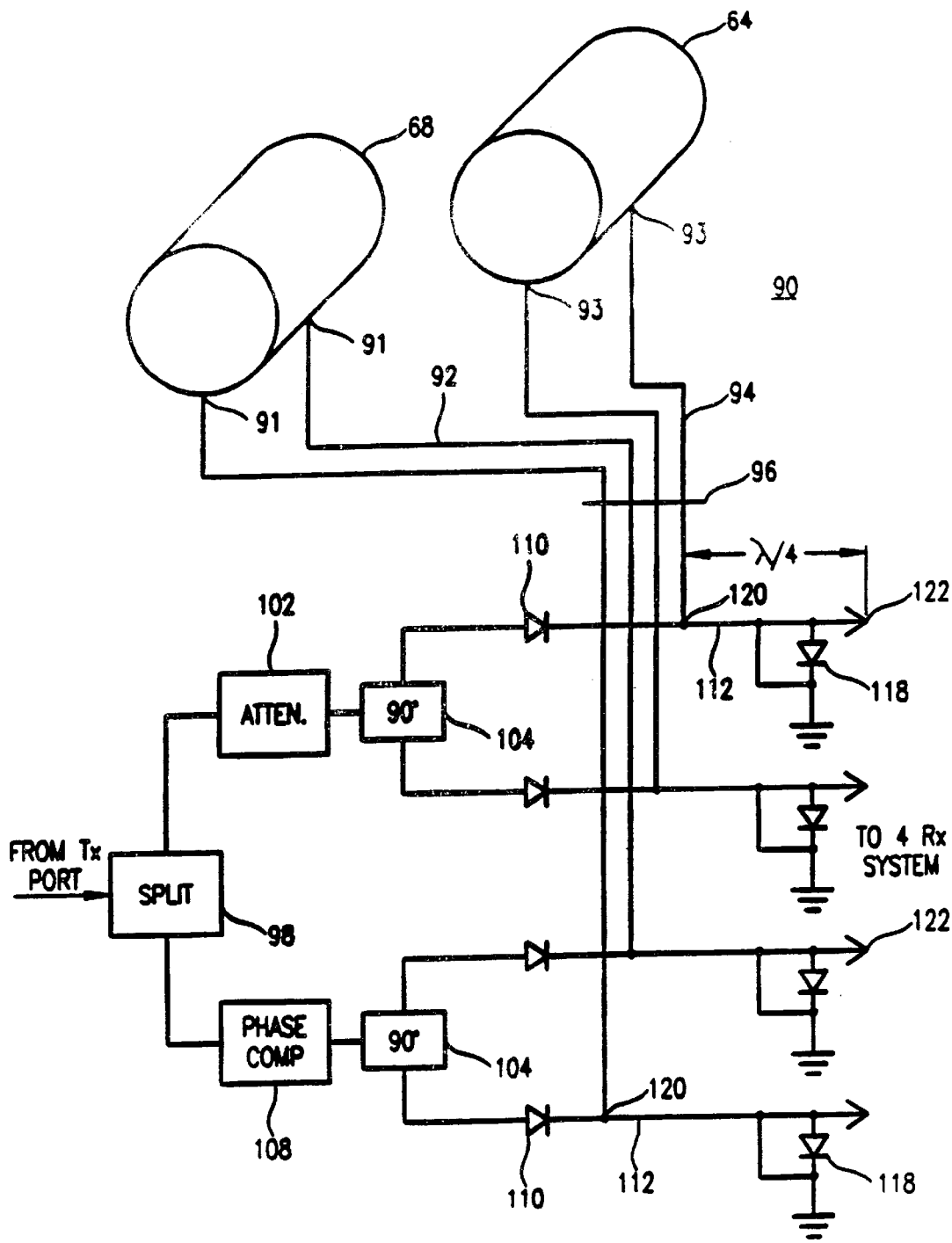
FIG. 5 is a schematic diagram illustrating one of the many possible ways in which the multiple quadrature receiver/transmitter coil system of FIG. 4 can be electrically connected to a magnetic resonance imaging (MRI) system.

Referring now to FIG. 5, there is shown a second preferred embodiment of the present invention including a coil interface subsystem 90 coupled to coils 64, 68. The subsystem 90 applies energy to extended transmit/receive coils 64, 68 and receives the output of coils 64, 68 to form images of selected regions of interest. Within subsystem 90, electrical energy is received from a conventional transmitter port by splitter 98 for the purpose of applying a magnetic field to the region of interest by coil 64, coil 68 or both.

Energy from splitter 98 is applied to phase compensator 108 to obtain the correct phase relationship between the fields of coils 64, 68. The output of phase compensator 108 is applied to a ninety degree element 104. The outputs of the ninety degree element 104 are applied to isolated contact points 91, displaced ninety degrees from each other, by way of leads 92 and socket 96. Disposing contact points 91 at ninety degrees with respect to each other causes the orthogonal component of the rotating magnetic field signal to be completely received within coil system 64, 68.

Because the energy required by larger coil 68 may be more than the energy required by smaller coil 64, the energy supply path of smaller coil 64 is provided with attenuator 102 at the output of splitter 98. Additionally, a ninety degree element 104 is provided as previously described. The four outputs of the ninety degree elements 104 thus determine relative amplitudes and phases for driving the inputs of coil system 60 with the appropriate power levels and signal phases to provide the most uniform transmit field possible. Energy from the outputs of the ninety degree element 104 is applied to coil 64 at contact points 93 by way of socket 96 and connectors 94. Contact points 93 are disposed ninety degrees from each other as described with respect to contact points 91. In this manner, coil system 60 is provided with two quadrature pairs separated spatially along the Z-axis. Additionally, the voltage level and the phase applied to coils 64, 68 can be adjusted to provide a uniform field. Coils 64 and 68 can be crossed saddle quadrature coils or Helmholtz pairs.

It will be understood that alternative arrangements of attenuation and phase compensation can be used to obtain the required results. For example, both the attenuation and the phase compensation can be applied to one of the coils 64, 68 without any additional attenuation or phase compensation being applied to the other coil 64, 68. For example, the attenuation and phase compensation can be applied to the path of inner coil 64 only. Furthermore, if inner coil 64 serves as a receive only coil without serving as a transmit coil, then transmit power is applied only to outer coil 68. In this case, the transmit power can be applied to contact points 91 by way of a ninety degree element without necessarily using any additional attenuation or phase compensation. Further in this case, inner coil 64 does not require transmit decoupling.

Figure 6:
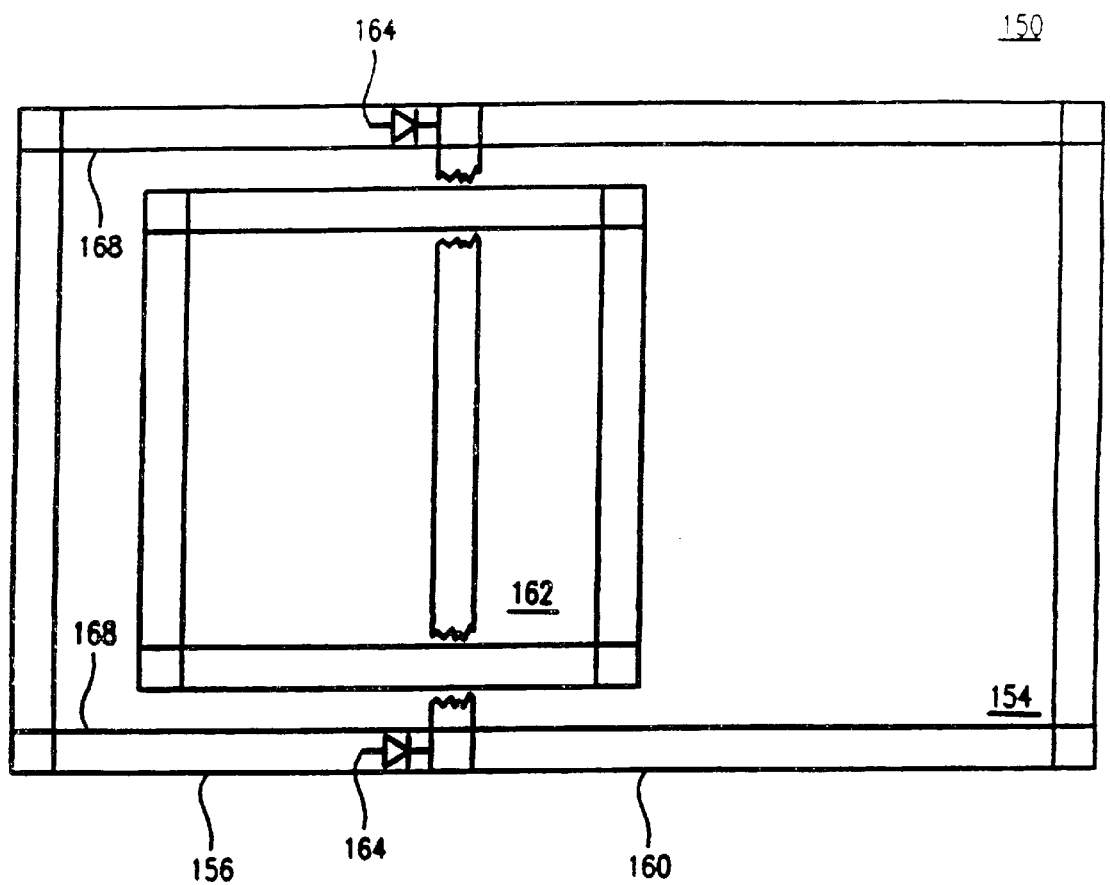
FIG. 6 is a side view of the multiple quadrature receiver/transmitter coil system according to one alternative embodiment of the present invention.

Referring now to FIG. 6, there is shown a side view of magnetic receiver/transmitter coil array system 150 of the present invention. Magnetic receiver/transmitter coil array system 150 is a preferred embodiment of the system of the present invention. Outer quadrature coil 154 and inner quadrature coil 162 are provided within magnetic receiver/transmitter coil array system 150 for performing substantially similar operations as those described with respect to coil array system 60.

For example, outer quadrature coil 154 is formed of coil sections 156, 160 wherein conductor rods 168 of coil section 156 are provided with PIN diodes 164. When PIN diodes 164 of coil section 156 are forward biased during transmission, the effective length of outer quadrature coil 154 is extended to be equal to the combined lengths of coil section 156 and coil section 160.

Each of the conductive rods 66, 82 and 84 of coil array system 60 can be provided with an adjustable tuning capacitor located at its mechanical center. The use of tuning capacitors in this manner is well known in the art and is not shown in order to simplify the drawings. The value of the tuning capacitors can be selected to allow each conductive rod 66, 82 and 84 to resonate at 63.87 MHz. A variable capacitor can be provided between the conductive rods containing the output contacts 91, 93. The additional variable capacitor can be used to optimize the isolation of the quadrature outputs.

A network for impedance matching the real part of the coil impedance to 50 Ω through the two lattice baluns can be provided for each of the four conductive rods 66, 82 having contacts 91, 93. This can be accomplished using a series capacitive divider and an impedance transformation in the baluns. Additionally, each output port 122 can be followed by a balancing network including two series connected lattice baluns that are resonant at 63.87 MHz.

As shown in FIG. 5, output lines 112 apply signals from coils 64, 68 to output ports 122 that can be coupled to a conventional four receiver (i.e., data acquisition) system. The physical length of output lines 112 is approximately 37 inches from its junction 120 to the receiver, corresponding electrically to ¼ wavelength. In the preferred embodiment, each output port 122 has a PIN diode 118 coupled to an output line 112. PIN diodes 118 act as switches to connect coils 64, 68 to the receiver system during data acquisition and to disconnect the receiver system from the transmit port during the transmit stage.

Figure 7:
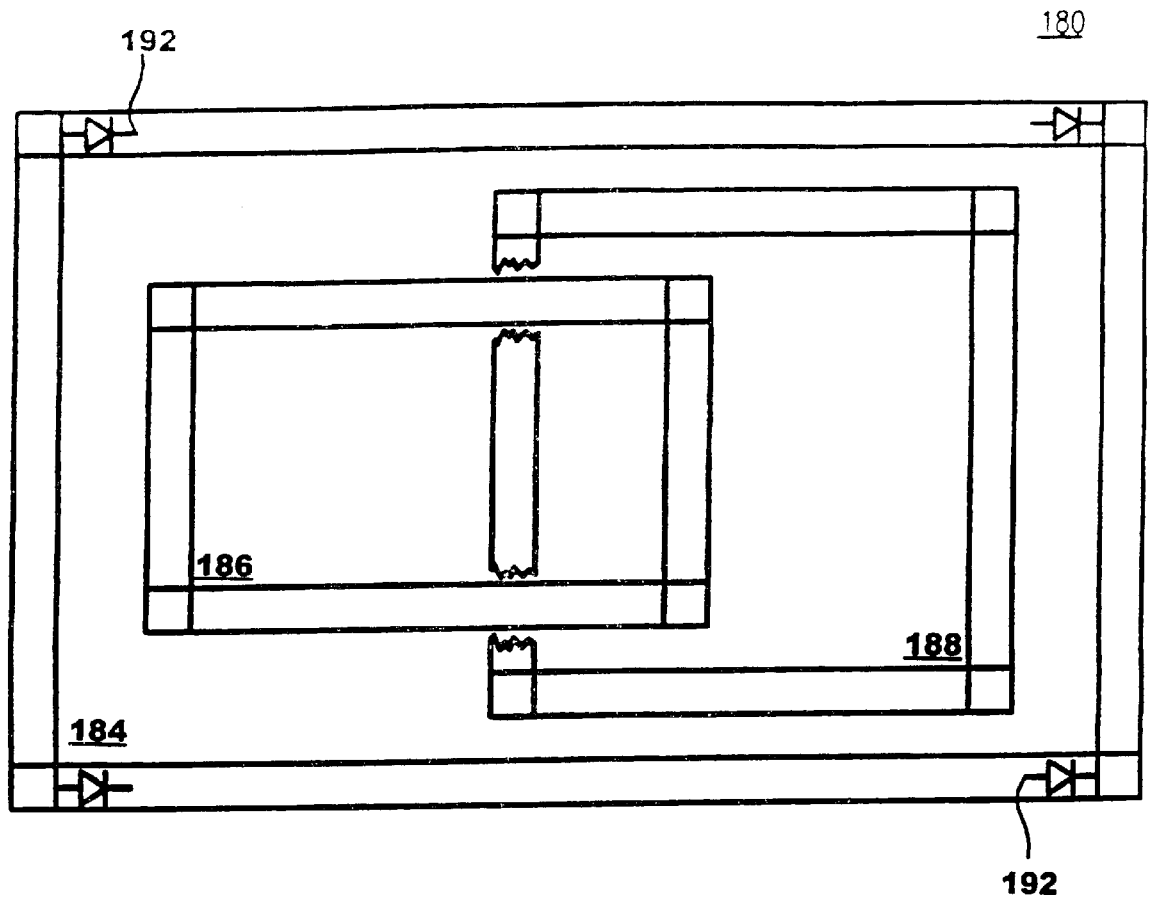
FIG. 7 is a side view of the multiple quadrature receiver/transmitter coil system according to another alternative embodiment of the present invention.

Referring now to FIG. 7, there is shown magnetic receiver/transmitter coil array system 180. Magnetic receiver/transmitter coil array system 180 is a preferred embodiment of the system of the present invention that includes outer coil element 184 and inner coil elements 186, 188. In the embodiment of FIG. 7, inner coil elements 186, 188 function as both receive elements and transmit elements. Excitation can be applied to inner coil elements 186, 188 by means of inductive coupling from external loops added to the coil. For example, four such loops can be used to excite a quadrature field in each of inner coil elements 186, 188.

As previously described with respect to coil system 60, splitters 104 can be used to provide four outputs of a selectively determined relative amplitude and phase to drive the four loops added to the current coil design with the appropriate power levels and signal phases to provide the most uniform transmit field possible. PIN diode networks 192 can be used to isolate the coil elements from the coil during transmission.

Thus, quadrature receiving coil system 60 and its alternate embodiments provide an improvement over previous receiving coils when multiple means for processing image signals are available. The sensitive volume of the coil system is expanded allowing for the interception of both quadrature components of MR signals in a spatially dependent manner, with each coil providing coverage of a portion of the desired sensitive volume along the axis parallel to the main magnetic field. Consequently, each coil had a sensitive volume smaller than that which would otherwise be necessary and each such coil provided improved signal to noise ratio from the region within its sensitive volume.

The above description is intended by way of example only and is not intended to limit the present invention in any way, except as set forth in the following claims. For example, it is to be understood that the present invention is not limited to two coil systems. Rather, the present invention may be embodied as an N-quadrature coil system, where N is an integer, and where N processing means are available for each coil system. Furthermore, the present invention can include any method and system for adding transmit capability to a quadrature phased array coil element by extending one part of the coil in transmit only, transmitting with both coils with proper amplitude and phase, and using external local transmit coil elements.

What is claimed is:

1. A coil system for use with a magnetic resonance imaging (MRI) system to form images of a region of interest, said coil system comprising:
   (a) a first coil having a plurality of electrically conductive members;
   (b) a second coil having a plurality of electrically conductive members, said first and said second coils cooperating to form a phased array coil subsystem; and
   (c) an interface subsystem for linking said phased array coil subsystem to said MRI system, said interface subsystem controllable by said MRI system such that (i) in a transmit state, said interface subsystem processes radio frequency (RF) power received from said MRI system to apply through said phased array coil subsystem a substantially uniform magnetic field to said region of interest and (ii) in a receive state, said interface subsystem receives from said phased array coil subsystem a response of said region of interest to said magnetic field and conveys said response to said MRI system.

2. The coil system as claimed in claim 1 wherein at least one of said first and said second coils is a quadrature coil.

3. The coil system as claimed in claim 2 wherein said first and said second coils each detect said response as quadrature components of a magnetic resonance signal of a portion of said region of interest covered thereby, and said interface subsystem conveys each of said quadrature components to a separate image processing port of said MRI system.

4. The coil system as claimed in claim 1 wherein at least one of said first and said second coils is a volume coil.

5. The coil system as claimed in claim 4 wherein said first coil defines a first coil volume and said second coil defines a second coil volume, said second coil being disposed at least partially within said first coil volume.

6. The coil system as claimed in claim 1 wherein said first and said second coils each detect said response as a magnetic resonance signal of a portion of said region of interest covered thereby, and said interface subsystem conveys each of said magnetic resonance signals to a separate image processing port of said MRI system.

7. The coil system as claimed in claim 1 wherein said interface subsystem, in said transmit state, processes said RF power through both said first coil and said second coil to apply therethrough said magnetic field to said region of interest.

8. The coil system as claimed in claim 7 wherein said interface subsystem, in said transmit state, produces coil-exciting signals of selected amplitude and phase for driving said first and said second coils so that said magnetic field is substantially uniform throughout said region of interest.

9. The coil system as claimed in claim 7 wherein said interface subsystem in said transmit state (i) produces a pair of coil-exciting signals for each of said first and said second coils with one of said pair being phase-shifted relative to the other of said pair and (ii) selectively attenuates said coil-exciting signals so that said magnetic field is substantially uniform throughout said region of interest.

10. The coil system as claimed in claim 1 wherein said interface subsystem includes PIN diodes by which said phased array coil subsystem is (i) coupled to a transmit port of said MRI system and decoupled from image processing ports of said MRI system during said transmit state and (ii) decoupled from said transmit port and coupled to said image processing ports during said receive state.

11. A coil system for use with a magnetic resonance imaging (MRI) system, said coil system comprising:
   (a) a first coil;
   (b) a second coil, said first and said second coils cooperating to form a phased array coil subsystem; and
   (c) an interface subsystem for linking said phased array coil subsystem to said MRI system, said interface subsystem controllable by said MRI system such that (i) in a transmit state, said interface subsystem processes radio frequency (RF) power received from said MRI system to apply through said phased array coil subsystem a substantially uniform magnetic field to said region of interest and (ii) in a receive state, said interface subsystem receives from said phased array coil subsystem a response of said region of interest to said magnetic field and conveys said response to said MRI system to form an image of said region of interest.

12. The coil system as claimed in claim 11 wherein at least one of said first and said second coils is a quadrature coil.

13. The coil system as claimed in claim 12 wherein said first and said second coils each detect said response as a magnetic resonance signal of a portion of said region of interest covered thereby, and said interface subsystem conveys each of said magnetic resonance signals to a separate image processing port of said MRI system.

14. The coil system as claimed in claim 12 wherein said first and said second coils each detect said response as quadrature components of a magnetic resonance signal of a portion of said region of interest covered thereby, and said interface subsystem conveys each of said quadrature components to a separate image processing port of said MRI system.

15. The coil system as claimed in claim 11 wherein at least one of said first and said second coils is a volume coil.

16. The coil system as claimed in claim 15 wherein said first coil has a plurality of conductive members and defines a first coil volume and said second coil has a plurality of conductive members and defines a second coil volume, said second coil being disposed at least partially within said first coil volume.

17. The coil system as claimed in claim 11 wherein said interface subsystem, in said transmit state, processes said RF power through both said first coil and said second coil to apply therethrough said magnetic field to said region of interest.

18. The coil system as claimed in claim 17 wherein said interface subsystem, in said transmit state, produces coil-exciting signals of selected amplitude and phase for driving said first and said second coils so that said magnetic field is substantially uniform throughout said region of interest.

19. The coil system as claimed in claim 17 wherein said interface subsystem in said transmit state (i) produces a pair of coil-exciting signals for each of said first and said second coils with one of said pair being phase-shifted relative to the other of said pair and (ii) selectively attenuates said coil-exciting signals so that said magnetic field is substantially uniform throughout said region of interest.

20. The coil system as claimed in claim 11 wherein said interface subsystem includes PIN diodes by which said phased array coil subsystem is (i) coupled to a transmit port of said MRI system and decoupled from image processing ports of said MRI system during said transmit state and (ii) decoupled from said transmit port and coupled to said image processing ports during said receive state.

21. A coil system for use with a magnetic resonance (MR) system for ascertaining the spectra of a region of interest, said coil system comprising:
   (a) a first coil;
   (b) a second coil, said first and said second coils cooperating to form a phased array coil subsystem; and
   (c) an interface subsystem for linking said phased array coil subsystem to said MR system, said interface subsystem controllable by said MR system such that (i) in a transmit state, said interface subsystem processes radio frequency (RF) power received from said MR system to apply through said phased array coil subsystem a substantially uniform magnetic field to said region of interest and (ii) in a receive state, said interface subsystem receives from said phased array coil subsystem a response of said region of interest to said magnetic field and conveys said response to said MR system.

22. A coil system for use with a magnetic resonance imaging (MRI) system to form images of a region of interest, the coil system comprising:
   (a) a first coil having at least one electrically conductive member;
   (b) a second coil having at least one electrically conductive member, said first and said second coils cooperating to form a phased array coil subsystem; and
   (c) an interface subsystem operably coupling said phased array coil subsystem to said MRI system, said interface subsystem operable (i) in a transmit state to process radio frequency (RF) power received from said MRI system to apply through said phased array coil subsystem a substantially uniform magnetic field to said region of interest and (ii) in a receive state to receive from said phased array coil subsystem a response of said region of interest to said magnetic field and to convey said response to said MRI system.

23. The coil system as claimed in claim 22 wherein at least one of said first and said second coils is a quadrature coil.

24. The coil system as claimed in claim 23 wherein said first and said second coils each detect said response as quadrature components of a magnetic resonance signal of a portion of said region of interest covered thereby, and said interface subsystem conveys each of said quadrature components to a separate image processing port of said MRI system.

25. The coil system as claimed in claim 22 wherein at least one of said first and said second coils is a volume coil.

26. The coil system as claimed in claim 25 wherein each of said first and said second coils is a birdcage coil.

27. The coil system as claimed in claim 25 wherein said first and said second coils each detect said response as a magnetic resonance signal of a portion of said region of interest covered thereby, and said interface subsystem conveys each of said magnetic resonance signals to a separate image processing port of said MRI system.

28. The coil system as claimed in claim 25 wherein said first coil defines a first coil volume and said second coil defines a second coil volume, said second coil being disposed at least partially within said first coil volume.

29. The coil system as claimed in claim 22 wherein said interface subsystem, in said transmit state, processes said RF power through both said first coil and said second coil to apply therethrough said magnetic field to said region of interest.

30. The coil system as claimed in claim 22 wherein said interface subsystem includes PIN diodes by which said phased array coil subsystem is (i) coupled to a transmit port of said MRI system and decoupled from image processing ports of said MRI system during said transmit state and (ii) decoupled from said transmit port and coupled to said image processing ports during said receive state.

31. The coil system as claimed in claim 22 wherein said first coil is one of crossed saddle coils, a Helmholtz pair, and a birdcage coil, and said second coil is one of crossed saddle coils, a Helmholtz pair, and a birdcage coil.

32. A coil system for use with a magnetic resonance (MR) system, the coil system comprising:
  (a) a volume coil;
  (b) a second coil, said volume and said second coils cooperating to form a phased array coil subsystem; and
  (c) an interface subsystem operably coupling said phased array coil subsystem to said MR system, said interface subsystem operable (i) in a transmit state to process radio frequency (RF) power received from said MR system to apply through said phased array coil subsystem a substantially uniform magnetic field to a region of interest and (ii) in a receive state to receive from said phased array coil subsystem a response of said region of interest to said magnetic field and to convey said response to said MR system.

33. The coil system as claimed in claim 32 wherein at least one of said volume and said second coils is a quadrature coil.

34. The coil system as claimed in claim 32 wherein said volume coil is a birdcage coil, and said second coil is one of crossed saddle coils, a Helmholtz pair, and a birdcage coil.

35. The coil system as claimed in claim 33 wherein said volume and said second coils each detect said response as quadrature components of a magnetic resonance signal of a portion of said region of interest covered thereby, and said interface subsystem conveys each of said quadrature components to a separate processing port of said MR system.

36. The coil system as claimed in claim 32 wherein said second coil is a volume coil.

37. The coil system as claimed in claim 36 wherein said second coil is a birdcage coil.

38. The coil system as claimed in claim 36 wherein said volume and said second coils each detect said response as a magnetic resonance signal of a portion of said region of interest covered thereby, and said interface subsystem conveys each of said magnetic resonance signals to a separate processing port of said MR system.

39. The coil system as claimed in claim 32 wherein said volume coil has a plurality of conductive members and defines a first coil volume and said second coil has at least one conductive member, said second coil being disposed at least partially within said first coil volume.

40. The coil system as claimed in claim 32 wherein said interface subsystem, in said transmit state, processes said RF power through both said volume coil and said second coil to apply therethrough said magnetic field to said region of interest.

41. The coil system as claimed in claim 32 wherein said interface subsystem includes PIN diodes by which said phased array coil subsystem is (i) coupled to a transmit port of said MR system and decoupled from processing ports of said MR system during said transmit state and (ii) decoupled from said transmit port and coupled to said processing ports during said receive state.

42. A coil system for use with a magnetic resonance (MR) system, the coil system comprising:
  (a) a first volume coil;
  (b) a second volume coil, said first and said second volume coils cooperating to form a phased array coil subsystem; and
  (c) an interface subsystem operably coupling said phased array coil subsystem to said MR system, said interface subsystem operable (i) in a transmit state to process radio frequency (RF) power received from said MR system to apply through said phased array coil subsystem a substantially uniform magnetic field to a region of interest and (ii) in a receive state to receive from said phased array coil subsystem a response of said region of interest to said magnetic field and to convey said response to said MR system.

43. The coil system as claimed in claim 42 wherein at least one of said first and said second volume coils is a quadrature coil.

44. The coil system as claimed is claim 43 wherein said first and said second volume coils each detect said response as quadrature components of a magnetic resonance signal of a portion of said region of interest covered thereby, and said interface subsystem conveys each of said quadrature components to a separate processing port of said MR system.

45. The coil system as claimed in claim 42 said first volume coil is one of crossed saddle coils, a Helmholtz pair, and a birdcage coil, and said second volume coil is one of crossed saddle coils, a Helmholtz pair, and a birdcage coil.

46. The coil system as claimed in claim 45 wherein said first volume coil is a birdcage coil, and said second volume coil is a birdcage coil.

47. The coil system as claimed in claim 42 wherein said first and said second volume coils each detect said response as a magnetic resonance signal of a portion of said region of interest covered thereby, and said interface subsystem conveys each of said magnetic resonance signals to a separate processing port of said MR system.

48. The coil system as claimed in claim 42 wherein said first volume coil has a plurality of conductive members and defines a first coil volume and said second volume coil has a plurality of conductive members and defines a second coil volume, said second volume coil being disposed at least partially within said first coil volume.

49. The coil system as claimed in claim 42 wherein said interface subsystem, in said transmit state, processes said RF power through both said first and said second volume coils to apply therethrough said magnetic field to said region of interest.

50. The coil system as claimed in claim 42 wherein said interface subsystem includes PIN diodes by which said phased array coil subsystem is (i) coupled to a transmit port of said MR system and decoupled from processing ports of said MR system during said transmit state and (ii) decoupled from said transmit ort and coupled to said processing ports during said receive state.

51. A phased array system for use with a magnetic resonance imaging system, the phased array system comprising:
  a first coil defining a first region;
  a second region, the first coil at least partially overlapping the second coil to define an overlap region formed by the intersection of the first and second regions; and
  an interface subsystem operably connected to the first and second coils, the interface subsystem operable to process RF power from the magnetic resonance imaging system to apply through the first and second coils a substantially uniform magnetic field to the overlap region and at least a portion of the first and second regions.

52. The phased array system of claim 51 wherein the first coil is formed of a plurality of electrically conductive members.

53. The phased array system of claim 51 wherein the second coil, is formed of a plurality of electrically conductive members.

54. The phased array system of claim 51 wherein the first coil is a volume coil and the first region is a first volume.

55. The phased array system of claim 54 the first coil is a birdcage coil.

56. The phased array system of claim 55 wherein the birdcage coil is a quadrature birdcage coil.

57. The phased array system of claim 51 wherein the first coil is a quadrature coil.

58. The phased array system of claim 51 wherein the second coil is a volume coil and the second region is a second volume.

59. The phased array system of claim 58 wherein the second coil is a birdcage coil.

60. The phased array system of claim 59 wherein the birdcage coil is a quadrature birdcage coil.

61. The phased array system claim 51 wherein the second coil is a quadrature coil.

62. The phased array system of claim 51 wherein the first and second coils are first and second volume coils and the first, second and overlap regions are first, second and overlap volumes.

63. The phased array system of claim 51 wherein the interface subsystem comprises a power splitter for splitting the RF power for delivery to the first and second coils.

64. The phased array system of claim 63 wherein the interface subsystem further comprises a phase compensator for adjusting the phase relationship of the RF power delivered to the first and second coils.

65. The phased array system of claim 63 wherein the interface subsystem further comprises a phase compensator for adjusting the phase relationship of the RF power delivered to the first and second coils.

66. The phased array system of claim 63 wherein the interface subsystem comprises a first ninety-degree element for providing two outputs to the first coil.

67. The phased array system of claim 63 wherein the interface subsystem comprises a second ninety-degree element for providing two outputs to the second coil.

68. The phased array system of claim 51 wherein the interface subsystem processes the RF power, in a first selectable state, to apply said substantially uniform magnetic field, and receives, in a second selectable state, a response to the applied magnetic field.

69. The phased array system of claim 68 wherein the interface subsystem comprises one or more switching devices for transitioning between the first and second selectable states.

70. The phased array system of claim 69 wherein the one or more switching devices comprises PIN diodes.

71. The phased array system of claim 51 wherein the first coil is a Helrnholtz coil or a saddle coil.

72. The phased array system of claim 51 wherein the second coil is a Helniholtz coil or a saddle coil.

73. The phased array system of claim 51 wherein the interface subsystem is connected to a transmit port and a receiver port of the magnetic resonance imaging system.

74. The phased array system of claim 51, further comprising a third coil defining a third region, the third coil at least partially overlapping the second coil to define a second overlap region formed by the intersection of the second region and the third region.

75. The phased array system of claim 51 wherein the interface subsystem is further operable to receive, through the first and second coils, a response of an anatomical structure placed within one or more of die first, second and overlap regions to the applied substantially uniform magnetic field.

76. A phased array RE coil system for use with a magnetic resonance imaging system, the phased array RF coil system comprising:
    a first RF coil defining a first region;
    a second RF coil defining a second region, the first RF coil partially overlapping the second RF coil to define an overlap region formed by the intersection of the first and second regions; and
    an interface subsystem operably connected wit the first and second RF coils, the interface subsystem comprising:
    a power splitter for splitting RF power for delivery to the first and second RF coils; and
    a phase compensator for adjusting the phase relationship of the RF power delivered to the first and second RF coils, such that a substantially uniform magnetic field is applied through the first and second RF coils to the overlap region and at least a portion of the first and second regions adjacent to said overlap region.

77. The phased array system of claim 76 wherein the interface subsystem further comprises
    an attenuator for decreasing the level of RF power delivered to the second RF coil with respect to the first RF coil.

78. The phased array system of claim 76 wherein the interface subsystem is connected to a transmit port and a receiver port of die magnetic resonance imaging system.

79. The phased array system of claim 76 wherein the first and second RF coils are quadrature RF coils.

80. The phased array system of claim 76 wherein the interface subsystem is further operable to receive, through the first and second RF coils, a response of an anatomical structure placed within one or more of the first, second and overlap regions to the applied substantially uniform magnetic field.

81. A magnetic resonance imaging system comprising:
    a first coil of a phased array system fanned of a first plurality of electrically-conductive members and defining a first volume;
    a second coil of the phased array system formed of a second plurality of electrically-conductive members and defining a second volume, said second coil disposed at least partially within the first coil to define an overlap volume formed by the intersection of the first and second volumes, said first and second coils cooperating to define a phased array coil subsystem; and
    a coil interface subsystem operably coupled to the phased array coil subsystem, said coil interface subsystem operable, in a first selectable state, to process RF power such that a substantially uniform magnetic field is applied through said first and second coils to the overlap volume and at least a portion of the first and second volumes, and, in a second selectable state, to receive a response of an anatomical structure to the applied magnetic field.

82. The magnetic resonance imaging system of claim 81 wherein said first and second coils are quadrature coils.

83. The magnetic resonance imaging system of claim 81 further comprising a third coil of the phased array system.

* * * * *

UNITED STATES PATENT AND TRADEMARK OFFICE
CERTIFICATE OF CORRECTION

PATENT NO. : 6,714,013 B2
DATED : March 30, 2004
INVENTOR(S) : George J. Misic

It is certified that error appears in the above-identified patent and that said Letters Patent is hereby corrected as shown below:

<u>Title page,</u>
Item [57], delete the present abstract and replace with the following:

A coil system enables a host magnetic resonance imaging (MRI) system to form high-resolution images of a region of interest. The coil system includes a first coil, a second coil, and an interface subsystem. The first and second coils each have a plurality of electrically conductive members, and cooperate to form a phased array coil subsystem. The interface subsystem links the phased array coil subsystem to the MRI system and is operated in a transmit state and a receive state. In the transmit state, the interface subsystem processes radio frequency (RF) power received from the MRI system to apply through the phased array coil subsystem a substantially uniform magnetic field to the region of interest. In the receive state, the interface subsystem receives from the phased array coil subsystem a response of the region of interest to the substantially uniform magnetic field and conveys the response to the image processing ports of the MRI system, which produces high resolution images therefrom.

Delete Column 2, Line 56 thru Column 3, Line 7 and replace with the following:

SUMMARY OF THE INVENTION

In one presently preferred embodiment, the invention provides a coil system for use with a magnetic resonance imaging (MRI) system to form images of a region of interest. The coil system includes a first coil, a second coil, and an interface subsystem. The first and second coils each have a plurality of electrically conductive members, and cooperate to form a phased array coil subsystem. The interface subsystem links the phased array coil subsystem to the MRI system and is operated in a transmit state and a receive state. In the transmit state, the interface subsystem processes radio frequency (RF) power received from the MRI system to apply through the phased array coil subsystem a substantially uniform magnetic field to the region of interest. In the receive state, the interface subsystem receives from the phased array coil subsystem a response of the region of interest to the substantially uniform magnetic field and conveys the response to the MRI system.

In a related aspect, the invention provides a coil system for ascertaining the spectra of a region of interest. The coil system includes a first coil, a second coil, and an interface subsystem. The first and second coils cooperate to form a phased array coil subsystem. The interface subsystem links the phased array coil subsystem to the MR system and is operated in a transmit state and a receive state. In the transmit state, the interface subsystem processes radio frequency (RF) power received from the MR system to apply through the phased array coil subsystem a substantially uniform magnetic field to the region of interest. In the receive state, the interface subsystem receives from the phased array coil subsystem a response of the region of interest to the substantially uniform magnetic field and conveys the response to the MR system.

UNITED STATES PATENT AND TRADEMARK OFFICE
CERTIFICATE OF CORRECTION

PATENT NO. : 6,714,013 B2
DATED : March 30, 2004
INVENTOR(S) : George J. Misic

It is certified that error appears in the above-identified patent and that said Letters Patent is hereby corrected as shown below:

Column 4,
Line 44, the sentence starting with "Coaxial leads 30a,b are connected to" should be the start of a new paragraph.

Column 12,
Line 49, "transmit ort" should read -- transmit port --.

Column 13,
Line 2, after "second coil" delete ",".
Line 6, between "claim 54" and "the" insert -- wherein --.
Lines 29-31, delete "a phase compensator for adjusting the phase relationship of the RF power delivered to the first and second coils" and insert
-- an attenuator for decreasing the level of RF power delivered to the second coil with respect to the first coil --.
Line 54, "Helrnholtz" should read -- Helmholtz --.
Line 56, "Helniholtz" should read -- Helmholtz --.

Column 14,
Line 2, "die" should read -- the --.
Line 5, "RE" should read -- RF --.
Line 13, "wit" should read -- with --.
Line 32, "die" should read -- the --.
Line 42, "fanned" should read -- formed --.

Signed and Sealed this

Seventeenth Day of August, 2004

JON W. DUDAS
*Acting Director of the United States Patent and Trademark Office*